US006990619B1

(12) United States Patent
Kapur et al.

(10) Patent No.: US 6,990,619 B1
(45) Date of Patent: Jan. 24, 2006

(54) SYSTEM AND METHOD FOR AUTOMATICALLY RETARGETING TEST VECTORS BETWEEN DIFFERENT TESTER TYPES

(75) Inventors: Rohit Kapur, Cupertino, CA (US); Thomas Williams, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 537 days.

(21) Appl. No.: 09/800,841

(22) Filed: Mar. 6, 2001

Related U.S. Application Data

(60) Provisional application No. 60/229,653, filed on Aug. 31, 2000.

(51) Int. Cl.
*G01R 31/28* (2006.01)

(52) U.S. Cl. ........................................ 714/729

(58) Field of Classification Search ................ 714/729, 714/727, 732, 733, 724, 734, 726; 324/765, 324/754, 158.1

See application file for complete search history.

(56) References Cited

U.S. PATENT DOCUMENTS 5,983,380 A * 11/1999 Motika et al. .............. 714/733
6,311,300 B1 * 10/2001 Omura et al. ............... 714/724

* cited by examiner

*Primary Examiner*—Albert Decady
*Assistant Examiner*—James C. Kerveros
(74) *Attorney, Agent, or Firm*—Bever, Hoffman & Harms, LLP; Jeanette S. Harms

(57) ABSTRACT

A system for automatically retargeting test vectors for application on tester systems having different performance capabilities is provided. The system includes a user selectable mode selector that can be adjustable between different performance modes, e.g. high, medium, and low. In high performance mode, the system allows test vectors to be applied using a high performance test system, e.g. a tester having high pin count. In low performance mode, the same test vectors can be applied but using a low performance test system, e.g. a tester having low pin count. By allowing the same test vectors to be used in a high performance or a low performance test environment, a testing facility can make maximum use of its available testing equipment for efficiently testing a device.

29 Claims, 12 Drawing Sheets

600

```
MacroDefs {
        Do_one_test {
            W normal_timing;
            C { scan_enable = 1; control_inputs = 'control_inputs'; }
            If ( reconfig_signal == many_inputs )
            {
610         640→ Shift { V { si1 = 'si1'; si2 = 'si2'; so1 = 'S01_p'; so2 = 'S02_p'; clk'=P;}}
                 C { scan_enable = 0;}
                 V { func_inputs = 'func_inputs'; func_outputs = 'func_outputs'; } ← 650
            {
            If ( reconfig_signal == few _inputs )
            {
                 Shift { V { si1 = 'si1 si2'; so2 = 'so2 so1'; ← 660
620                              funcIn = 'func_inputs'; funcOut = 'func_outputs_p'clk = P;} ← 670
                 C { scan_enable =0; }
            {
            V { clk = P;} —680
        {
{
```

FIGURE 7B

SYSTEM AND METHOD FOR AUTOMATICALLY RETARGETING TEST VECTORS BETWEEN DIFFERENT TESTER TYPES

RELATED US APPLICATION

This patent application claims priority to U.S. provisional patent application Ser. No. 60/229,653, filed Aug. 31, 2000, entitled "Tester Retargetable Patterns," by Kapur et al.

FIELD OF THE INVENTION

The field of the present invention pertains to the testing of integrated circuits using automated testing equipment (ATE). More particularly, the present invention pertains to a method and system for efficiently allowing testers of various pin capacities to apply the same set of test vectors that were designed for a high pin capacity tester.

BACKGROUND OF THE INVENTION

Computer systems and electronic devices are continually growing in capability and complexity. The size and complexity of integrated electronic systems are likewise increasing, making it critical that the component parts of these systems operate without fault. This requires that each component, or integrated circuit "chip," be rigorously tested before it is sold. However, as integrated circuit chips become more powerful, the methods and systems required to detect flaws within them become increasingly sophisticated and expensive.

Integrated circuit designs have become more complex in part because they are made more dense. As a result, they have become progressively harder to test in order to ensure correct and complete functionality. Higher densities are achieved in part by reducing the amount of space between transistors and other components which comprise the integrated circuit. As such, the "place and route" tolerances for the integrated circuit are reduced, and the potential for introducing fabrication errors and introducing structural faults in the circuit increases. Additionally, the complicated placement of the internal structure and nature of the defects encountered in such high density integrated circuits requires the use of sophisticated algorithms in order to ensure adequate defect detection, e.g., being able to determine whether structural defects between the closely spaced gate elements, such as a bit short, broken link, or the like, exist. Hence, the testing cost can be very significant for the latest and largest high density integrated circuits.

Very sophisticated test programs, called automatic test pattern generation (ATPG) programs, are used to analyze the integrated circuit designs and generate therefrom test patterns (e.g., also referred to as test programs or test vectors) used for testing the devices in ATE systems. The objective of the ATPG program is to generate an accurate, high defect coverage test pattern as efficiently as possible, to reduce the cost. As a result of analyzing the target design, the ATPG tool determines a stimulus for all the accessible points of the target design. During chip verification, this stimulus is applied by the tester to the integrated circuit and the real time response of the chip is compared with the pre-computed response of the test pattern.

As discussed above, testing systems, or "testers" are used to apply test vectors to a device under test, capture the test results and shift them out for examination and comparison. However, as with any resource, test facilities have testers of different capabilities and configurations. The testers differ in their clocking characteristics, their power supply capabilities, their memory resources used behind each pin, and most importantly, they different in the number of pins that can supply and receive scan data and functional inputs/outputs, etc. Typically, the more pins available on a tester, the more expensive the tester equipment. For example, today testers cost approximately $5,000.00 per pin supported. The more pins the tester can drive, the more scan chains a design can implement. The more scan chains available, the shorter the scan chains can be, thereby reducing the time it takes to load them up. Conversely, a tester with few pins only supports a design having fewer but longer scan chains. Therefore, testers with high pin count can drive many scan chains and the more scan chains available, the shorter they can be, the faster they load and the more economical the test.

FIG. 1A illustrates an integrated circuit device 18 having fewer external pins, but larger sized scan chains 12*a*–12*d*. Scan chains, as are well known, contain scan cells (sequential elements) coupled in series. Because pin count is restricted, only a few scan chains can be accommodated, so they are longer. The reduced number of scan chains require fewer numbers of scan-in pins 14 and scan-out pins 16. Unfortunately, the longer scan chains require more time to scan-in and scan-out their data. This leads to a low performance, low pin count, testing environment. The test vectors developed for this system are also longer and incompatible with high performance testers. ATPG processes that generate long test vectors are used for lower performance testers. FIG. 1D illustrates a low performance, low pin count, tester 40 applied to a device under test 44. The device 44 is placed into a multi-pin socket 46 which connects to the low pin interface 42.

FIG. 1B illustrates an integrated circuit device 26 having many external pins and shorter scan chains 20*i*. Because the scan chains are shorter, there are many of them and they require high numbers of scan-in pins 22 and scan-out pins 24. The test vectors are also shorter and incompatible with low performance testers. The shorter scan chains 20*i* require less time to scan-in and scan-out their data and this leads to a high performance, higher pin count, testing environment. This discussion assumes the scan rates are equal. ATPG processes that generate many short test vectors are used for high performance testers. FIG. 1C illustrates a high performance, high pin count, tester 30 applied to a device under test 34. The device 34 is placed into a multi-pin socket 36 which connects to the high pin interface 32.

Although testers vary in pin capacity, nevertheless, the test data generated by ATPG processes is typically generated in an environment that is oblivious to the tester capabilities. For example, in many cases, test patterns tend to be routinely developed for high performance testers without knowing the capabilities of the test facility. This is done because most test engineers are geared to reduce test application time. However, to limit costs, a test facility typically acquires some low cost testers and some high cost testers, which differ in the number of full functional pins they have. If a test facility (e.g., having a mix of both high and low capacity testers) receives test vectors developed for high performance testers, the result will be that many of their low cost testers are left idle because of test vector incompatibility. Having any of these testers idle is a waste of resources and money. It would be advantageous, then, to provide a system that can make full use of the various different types of testers that a facility has but is based on a single set of developed test vectors.

SUMMARY OF THE INVENTION

Accordingly, the present invention provides a system and a method for making full use of the various different types of testers that a test facility has but uses a single set of developed test vectors. The present invention therefore leverages pin count differences among the testing systems and allows all equipment to be used on the test floor based on a single set of test vectors. The present invention provides a system and method for the dynamic and automatic reconfiguration of test circuitry internal to a chip to change the pin requirements of the data to better match a tester system. In this way, the present invention allows a single set of test patterns to be retargetable to any tester system (e.g., high or low pin capacity) in order to better utilize expensive testing hardware and therefore save costs in the testing phase of integrated circuit fabrication.

A system and method are described herein for automatically retargeting a single set of test vectors for application on tester systems having different performance capabilities, e.g., different pin capacities. The system includes a user selectable mode selector that can be adjustable between different test performance modes, e.g., high test mode, medium test mode and low test mode, in one instance. In the high performance test mode, the system allows the single set of test vectors to be applied efficiently on a high performance test system, e.g., a tester having a high pin count. In the low performance test mode, the same test vectors can be applied but using a low performance test system, e.g., a tester having a low pin count.

By allowing the same set of test vectors to be used in a high performance or a low performance testing environment, a testing facility can make maximum use of its available testing equipment for efficiently testing an integrated circuit device thereby reducing the costs of testing the integrated circuit devices by reducing the numbers of idle test equipment. The set of test vectors used, in one embodiment, are developed for a high performance test system. The novel system alters the communication protocol used to deliver the test vectors, and the functional inputs, depending on the performance mode selected by the user. However, the test data itself does not change over the different performance modes. The novel system includes on-chip circuitry that can automatically reconfigure the number and the size of the scan chains within the integrated circuit depending on the performance mode selected. Other techniques and configurations are used for reducing the number of functional input/output pins required to perform a test, while still being able to use test vectors designed for high performance test systems.

More specifically, an embodiment of the present invention includes an integrated circuit device for communicating with a first tester of a first pin capacity to receive test vectors developed for a second tester of a second pin capacity, the device comprising: scan chains; and reconfiguration logic coupled to the scan chains and for altering the number of pins required to test the device under test by reconfiguring the individual length and number of the scan chains based on a mode signal, the reconfiguration logic providing compatibility between the test vectors and the second tester having the second pin capacity, the mode signal selecting between the first tester and the second tester.

Another embodiment of the present invention includes an automated testing equipment (ATE) system for testing an integrated circuit device comprising: a storage medium for storing a set of test vectors developed for a tester having a first pin capacity; a user selector selecting modes between a tester having the first pin capacity and a tester having a second pin capacity; and a device under test for coupling with one of the testers to receive the test vectors, the device under test comprising: scan chains; and reconfiguration logic coupled to the scan chains and for altering the number of pins required to test the device under test by reconfiguring the individual length and number of the scan chains based on the user selector, the reconfiguration logic providing compatibility between the test vectors and the tester having the second pin capacity.

BRIEF DESCRIPTION OF THE DRAWINGS

The present invention is illustrated by way of example and not by way of limitation, in the figures of the accompanying drawings and in which like reference numerals refer to similar elements and in which:

FIG. 7B illustrates pseudo code in accordance with one embodiment of the present invention implementing test sequences for applying a single set of test vectors to either a high performance tester or a low performance tester.

DETAILED DESCRIPTION OF THE INVENTION

Reference will now be made in detail to the embodiments of the invention, a method and system for automatically retargeting test vectors developed for a high performance tester to be applied by either a low performance tester or a high performance tester based on a mode selector, examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Notation and Nomenclature

Figure 6:
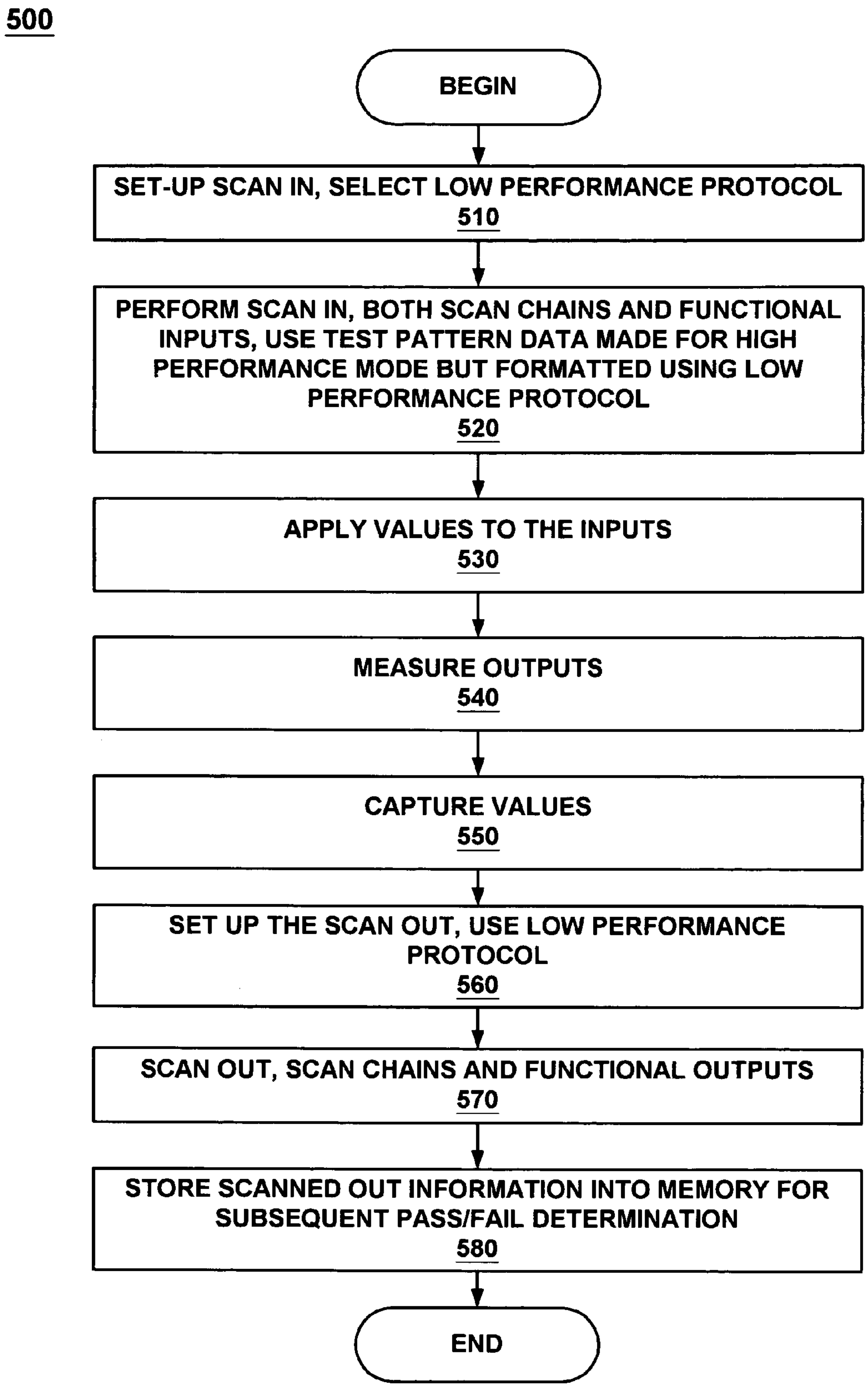
FIG. 6 illustrates a flow diagram of steps performed in accordance with an embodiment of the present invention for a method of applying test vectors developed for a high performance tester but using a low performance tester.

Some portions of the detailed descriptions which follow are presented in terms of procedures, steps, logic blocks, processing, and other symbolic representations of operations on data bits within a computer memory, e.g., flow diagram 500 of FIG. 6 and the pseudo code of FIG. 7B. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "simulating," "translating," "instantiating," "determining," "displaying," "recognizing," or the like, sometimes refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

Ate Computer System Platform 112

Figure 1A:
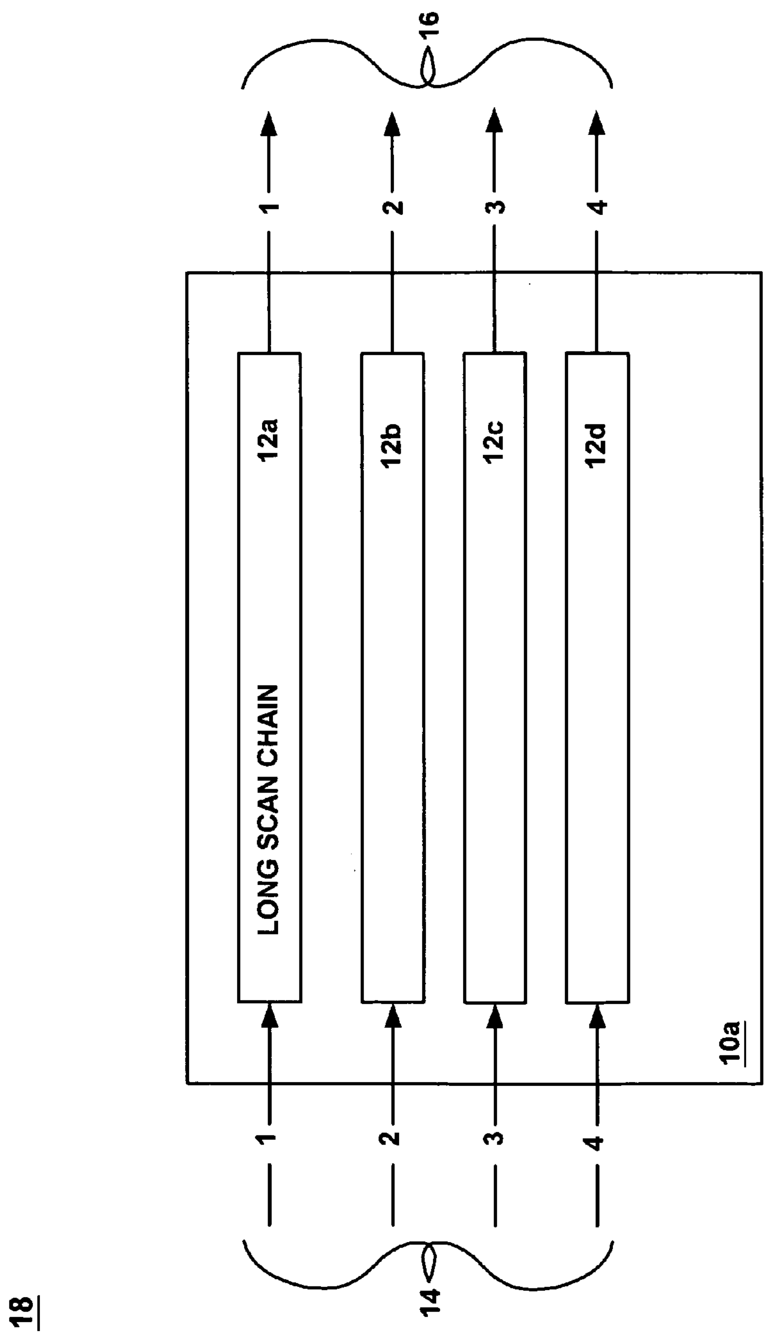
FIG. 1A illustrates an integrated circuit device having long scan chains and low pin count thereby compatible with a low performance, and therefore a low cost, tester system.
Figure 1B:
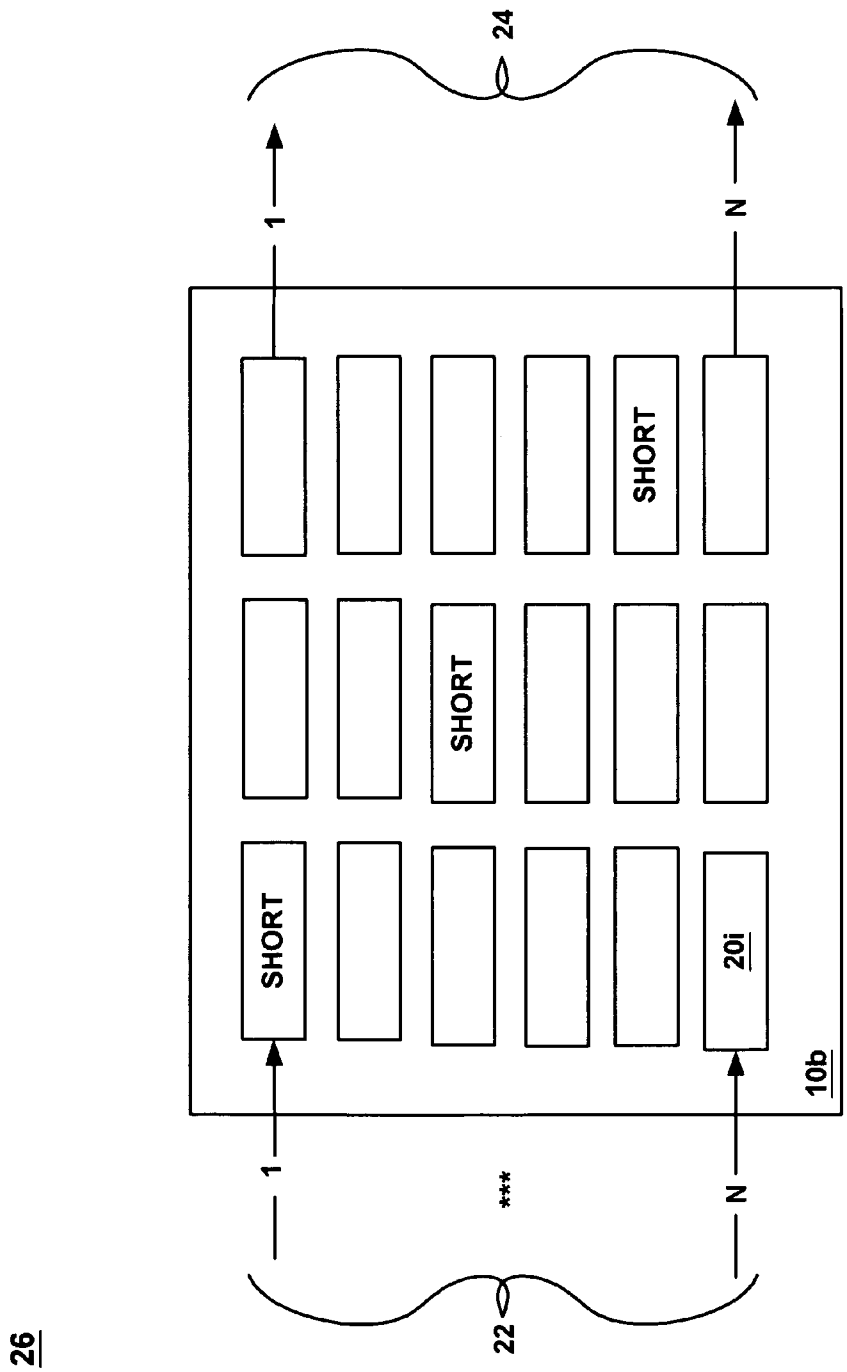
FIG. 1B illustrates an integrated circuit device having many short scan chains and high pin count thereby compatible with a high performance, and therefore a high cost, tester system.
Figure 1C:
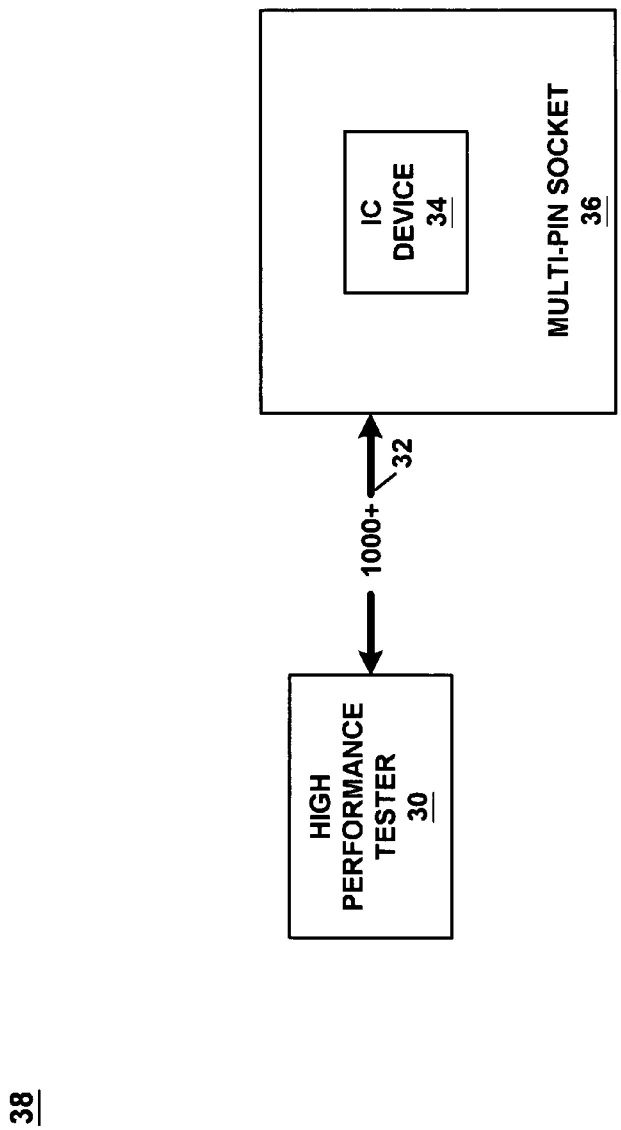
FIG. 1C illustrates a high performance tester system having a high pin count (e.g., 1000+ pins) interface coupled to a device under test using a multi-pin socket.
Figure 1D:
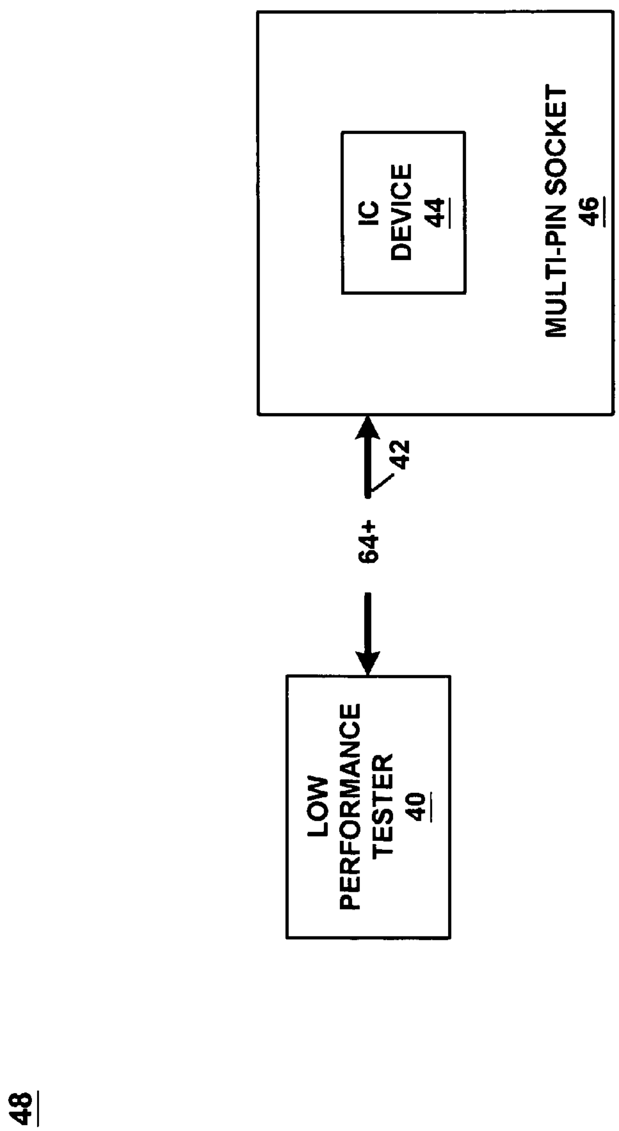
FIG. 1D illustrates a low performance tester system having a low pin count (e.g., 64+ pins) interface coupled to a device under test using a multi-pin socket.
Figure 2:
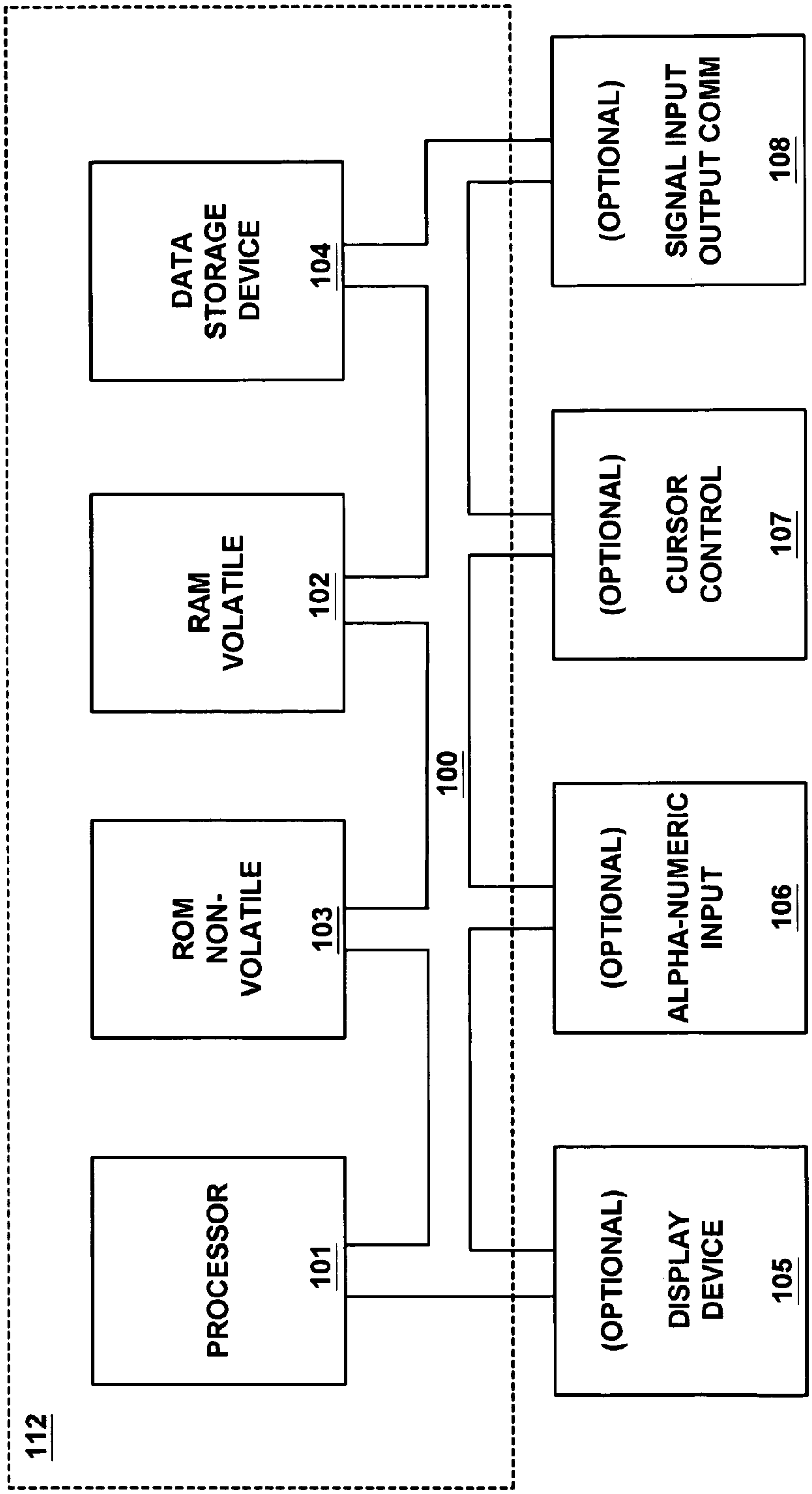
FIG. 2 is a diagram of computer system portion of an automatic test equipment (ATE) system upon which embodiments of the present invention can be practiced.

Referring to FIG. 2, automatic test equipment (ATE) can contain one or more computer systems for performing automated testing functionality. A computer system 112 is illustrated. Within the following discussions of the present invention, certain processes and steps are discussed that are realized, in one embodiment, as a series of instructions (e.g., software program) that reside within computer readable memory units of system 112 and executed by processors of system 112. When executed, the instructions cause computer system 12 to perform specific actions and exhibit specific behavior which is described in detail to follow.

In general, the system 112 of the present invention includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101.

System 112 of FIG. 2 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

Tester Retargetable Patterns

Figure 3:
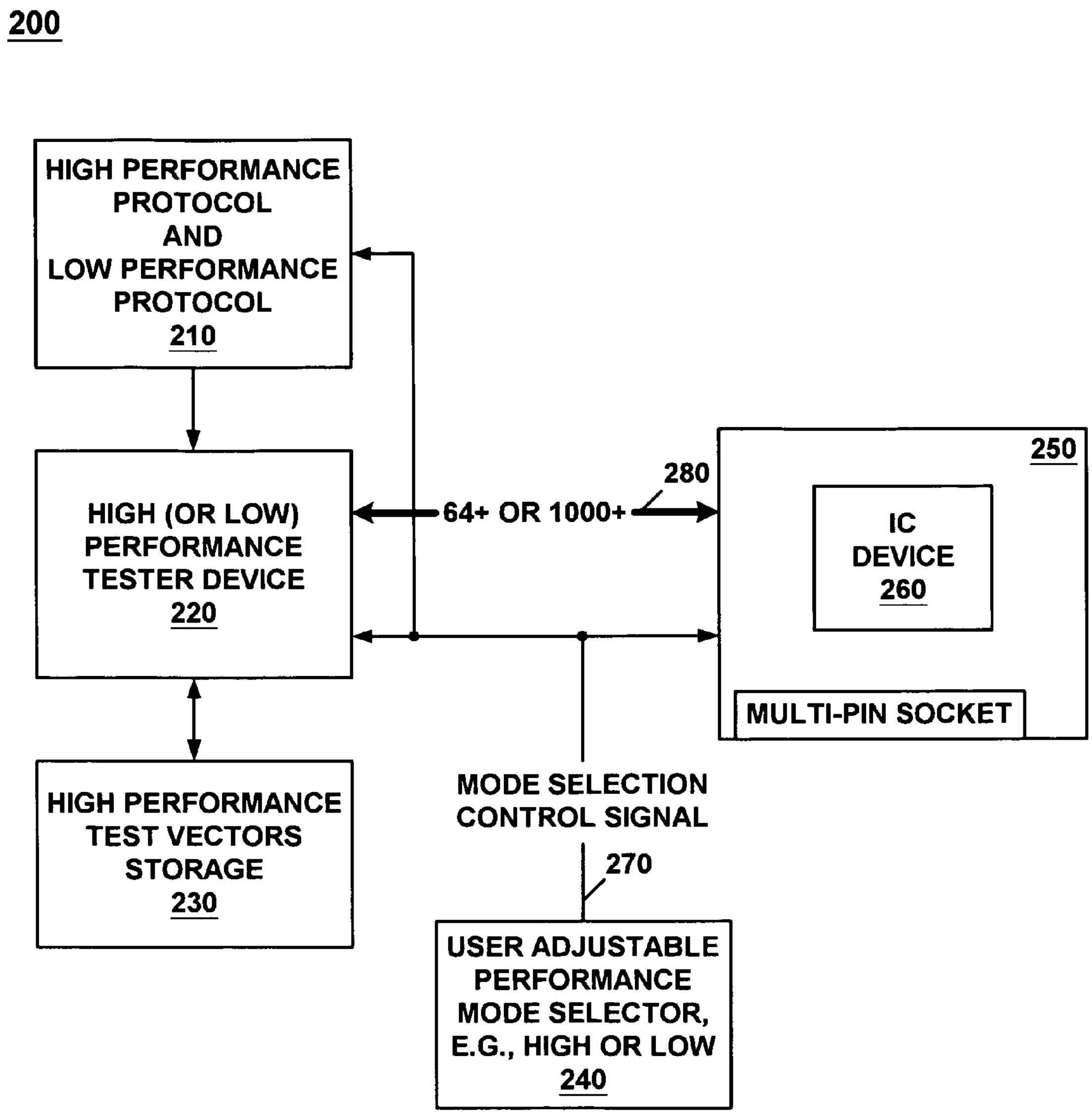
FIG. 3 illustrates a system in accordance with an embodiment of the present invention having a performance mode selector allowing either a high performance test system or a low performance test system to use the same set of test vectors on a device under test.

FIG. 3 illustrates a testing configuration 200 in accordance with an embodiment of the present invention. Configuration 200 allows a single set of test patterns, e.g., test data 230, to be used by either a high performance or a low performance tester 220 in the testing of a device under test 260. In the configuration 200, the device under test 260 is an integrated circuit device that may be mounted in a multi-pin socket 250 that is connected via a multi-pin interface 280 to the tester (either high or low performance) 220. The number of active pins in the multi-pin interface 280 depends on the performance level of the tester being employed to perform the test. In one example, a high performance tester contains 1000 or more active pins in the interface 280 while a low performance tester contains 64 or more active pins in the interface 280. An active pin represents a pin that resides in the interface connector and is actually used by the tester.

Importantly, the configuration 200 provides a test mode selector 240 that can be user adjustable. The mode selector indicates the performance level of the tester 220 being employed to perform the testing operations. A mode selection signal is then carried over line 270. The mode selection signal line 270 is connected to the device under test 260 and also coupled to a protocol unit 210. Depending on the test mode, the mode signal over line 270 causes on-chip circuitry (in device 260) to reconfigure such that it becomes compatible with testers of different pin capacities. In the example shown in FIG. 3, the possible performance mode selections available are low and high, however, based on this example, the configuration 200 can readily be expanded and extended to encompass multiple other discrete performance levels, e.g., low, medium, high, etc.

The protocol unit 210 of FIG. 3 contains different communication protocols used for the different performance levels supported. That is to say, while the same test vectors 230 are used for high or low performance testers, the communication protocol that is used to apply these test vectors, and used to acquire the resulting test data, is different depending on the performance level selected by control signal line 270. The communication protocol is often called a "test sequence." Test information is composed of test data 230 and the test sequence. The test sequence contains the operations required to get the test data into the scan chains and apply the test. According to the present invention, the test data 230 does not need to be changed for the different configurations of the scan chains (discussed more below). However, the test sequence is changed moderately to make the dynamic performance selection possible.

In accordance with an embodiment of the present invention, to allow for a flexible number of pins used by the test data, some design for test (DFT) circuitry is put into the device 260 ("on-chip") such that the total pin count required from the tester 220 can be varied. Reconfiguration is provided, in one embodiment, through multiplexers controlled by a few selected pins which indicate the selected performance mode.

Figure 4A:
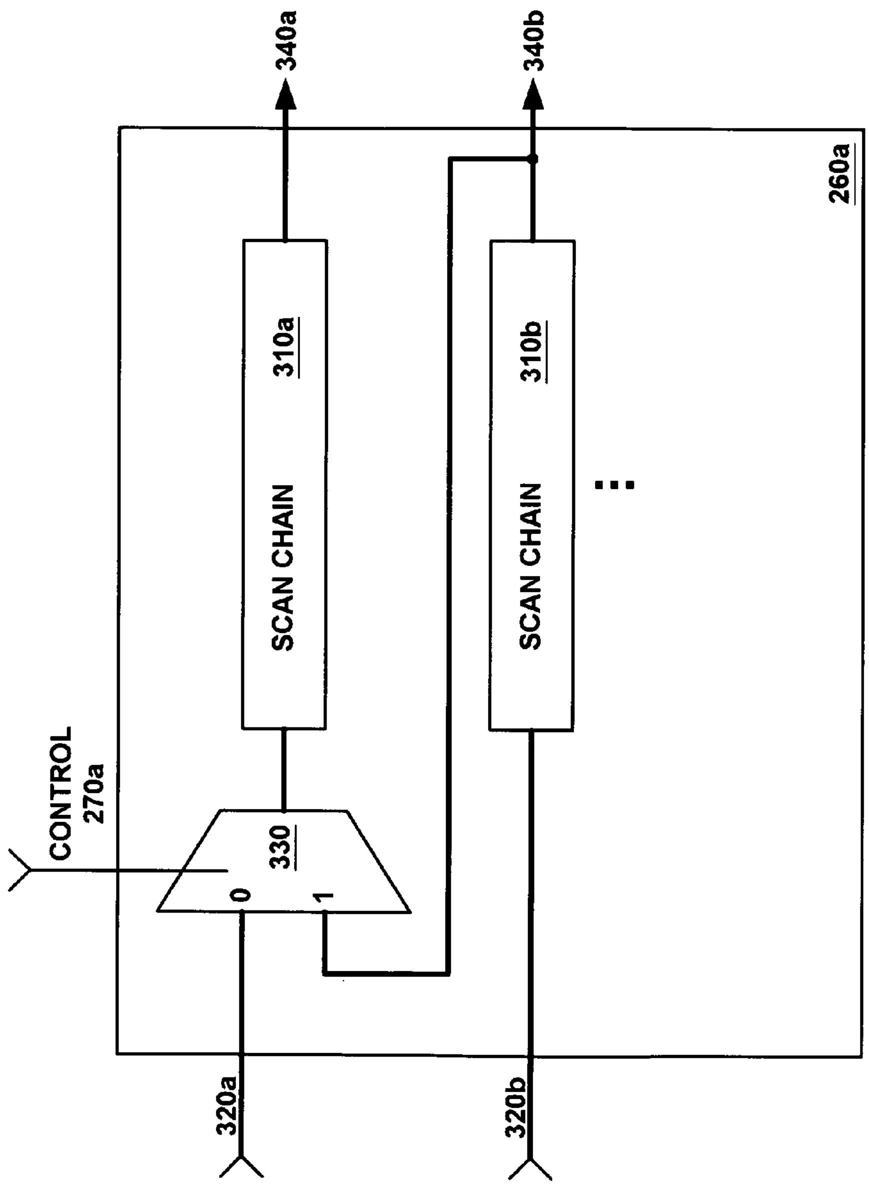
FIG. 4A illustrates on-chip reconfiguration circuitry, responsive to the mode selector, for reconfiguring the length of the internal scan chains within an integrated circuit device (under test) in accordance with an embodiment of the present invention.
Figure 4B:
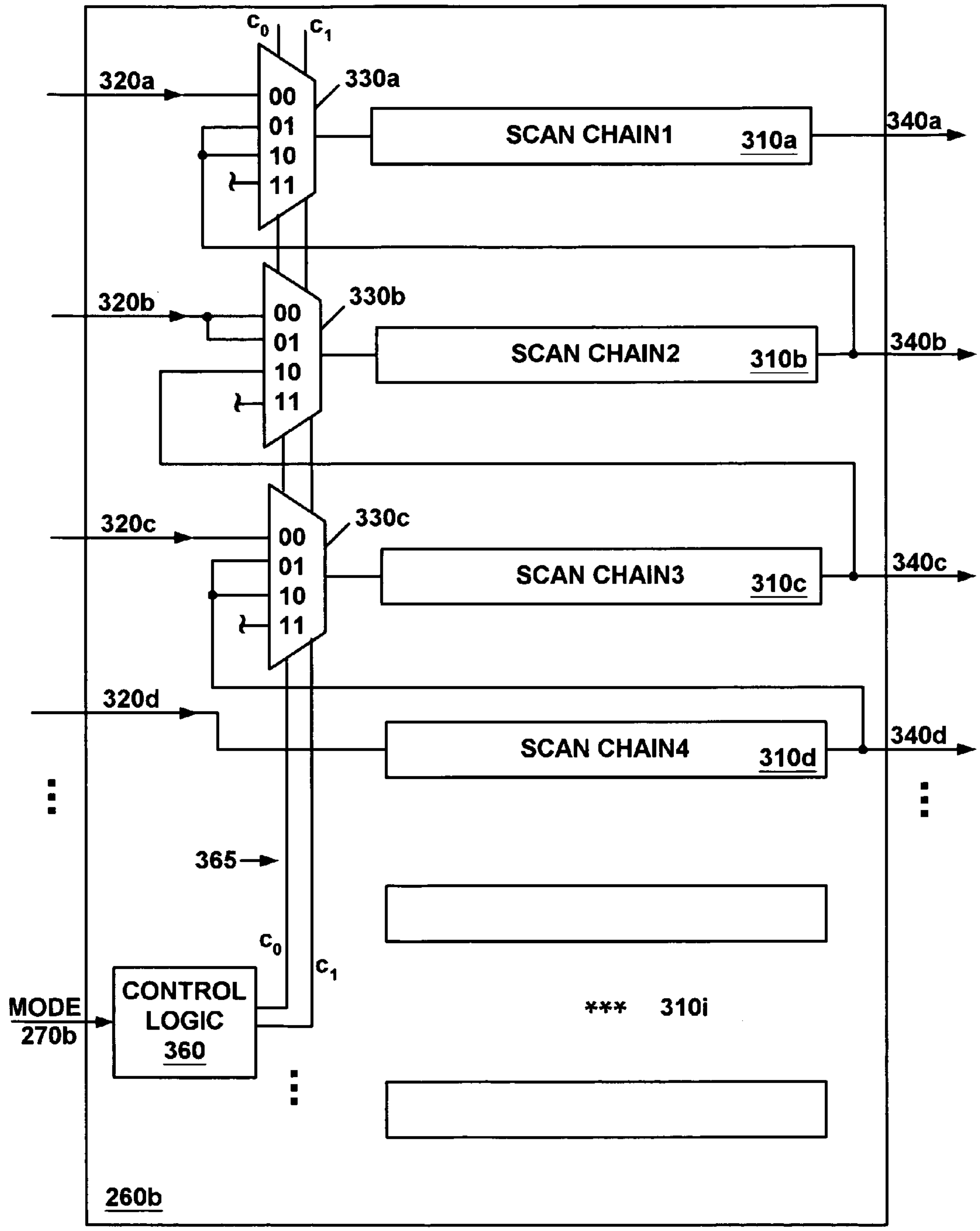
FIG. 4B illustrates another example of on-chip reconfiguration circuitry, responsive to the mode selector, for reconfiguring the length of the internal scan chains within an integrated circuit device (under test) in accordance with an embodiment of the present invention.
Figure 5:
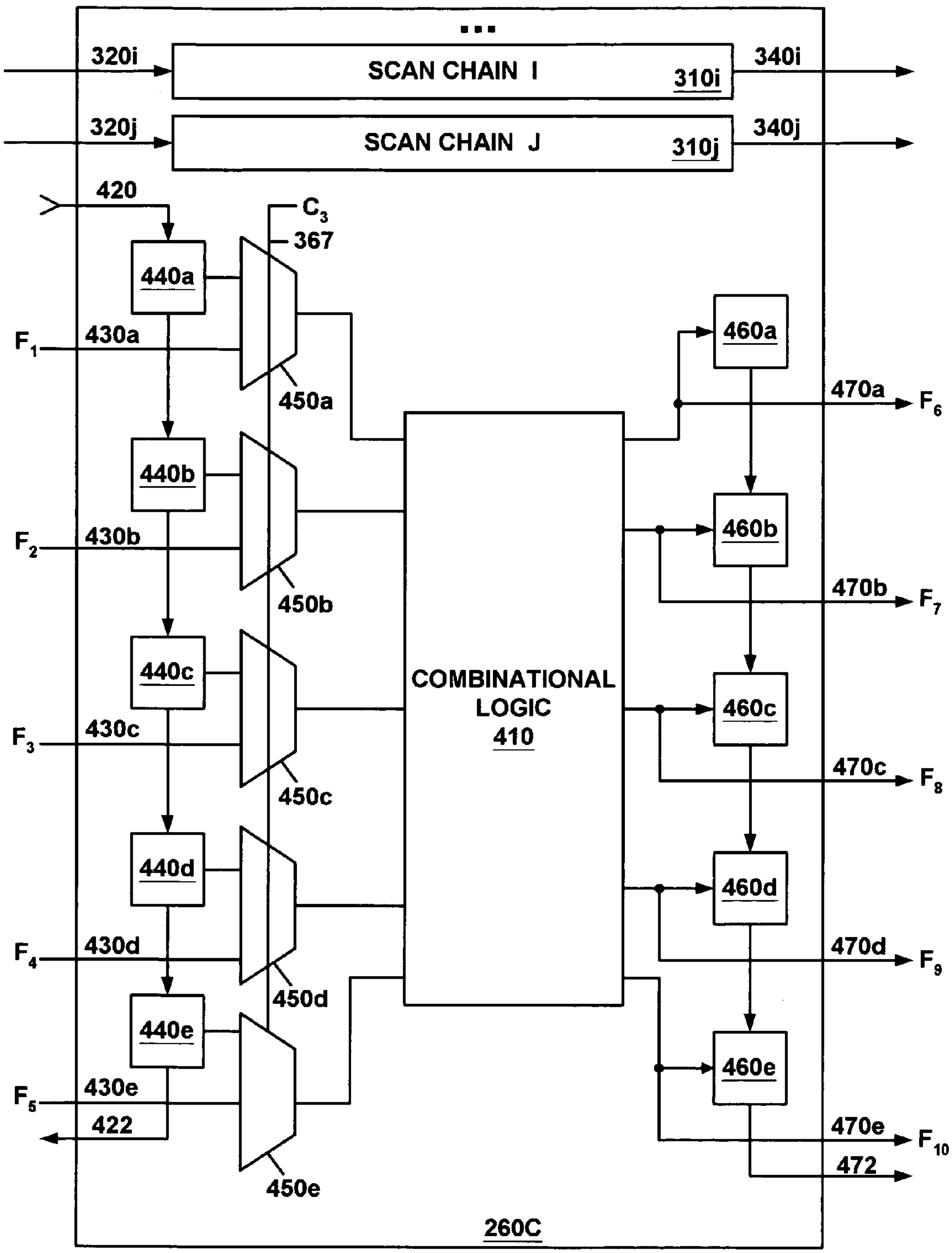
FIG. 5 illustrates on-chip reconfiguration circuitry in accordance with an embodiment of the present invention for reconfiguring functional inputs/outputs between a high performance test mode and a low performance test mode.

There are three types of input/outputs to the design 260, namely, the control inputs, the scan input/outputs and the functional input/outputs of the design 260. Scan inputs feed scan chains while functional inputs feed combinational logic. In order to provide a low performance interface, the embodiments of the present invention reconfigure the application of test and other data to utilize a reduce set of pins. While the control inputs are largely not changed, the remaining inputs and outputs (e.g., scan and functional) are reconfigurable to minimize the number of pins needed on the tester. FIG. 4A and FIG. 4B illustrate examples of the manner in which the present invention reconfigures the logic on the device 260 in order to vary the number of scan-in and scan-out pins to accommodate different testers. FIG. 5 illustrates examples of the manner in which the present invention reconfigures the logic on the device 260 in order to vary the number of functional input and output pins to accommodate different testers.

FIG. 4A illustrates an exemplary device under test 260*a* including its scan circuitry and certain DFT circuitry 330 added in accordance with the present invention for providing performance reconfiguration. Although the present invention can be applied to numerous configurations of the design, with different pin counts and requirements from the tester, two exemplary configurations are described below with respect to the scan data. In one configuration, a high pin count is used including individual functional inputs and many balanced scan chains for low test application time. Another configuration is discussed that has a very low pin count achieved at the trade-off of higher test application times caused by longer scan chains.

Mux 330 of FIG. 4A can be viewed as reconfiguration logic. In this example, two modes of operation are supported, high performance and low performance. Two exemplary scan chains of equal length, L, 310*a* and 310*b* are shown. The scan chains are comprised of L number of individual scan cells (e.g., sequential cells) that are coupled in series. Scan chains, scan cells and scan enable signals are described in more detail in the following U.S. Patents which are incorporated herein by reference: U.S. Pat. No. 5,696,771, issued Dec. 9, 1997, entitled "Apparatus for Performing Partial Unscan and Near Full Scan within Design for Test Applications," Ser. No. 08/649,788; U.S. Pat. No. 5,949,692, issued Sep. 7, 1999, entitled "Hierarchical Scan Architecture for Design for Test Applications," Ser. No. 08/704,129; U.S. Pat. No. 5,703,789, issued Dec. 30, 1997, entitled "Test Ready Compiler for Design for Test Synthesis," Ser. No. 08/581,187; and U.S. Pat. No. 5,903,466, issued May 11, 1999, entitled "Constraint Driven Scan Insertion for Design for Test Applications," Ser. No. 08/581,379.

Each scan chain 310*a* and 310*b* has its own scan-in or scan-input 320*a* and 320*b*. Each scan chain also has a scan-out or scan output 340*a* and 340*b*. The scan-out 340*b* of scan chain 310*b* is connected to one input of multiplexer 330. The other input of the multiplexer is coupled to the scan-in 320*a*. The output of the multiplexer 330 is coupled to the input of the scan chain 310*a*. A control selector 270*a* is coupled to the select inputs of the multiplexer (mux) 330. In high performance mode, selector 270*a* is low and scan data is shifted into the scan chains using both scan-ins 320*a* and 320*b* and likewise scan data is shifted out of device 260*a* using both scan-outs 340*a* and 340*b*. In this case, 5 pins are used for scan data. A separate scan vector, S1 and S2, are shifted into each scan chain separately. At least L shift clocks are required to perform this function since the scan chains are L cells long. Simultaneously, test data is shifted out of the scan chains.

However, in low performance mode, line 270*a* is high. In this mode, scan-in 320*a* is ignored and also scan-out 340*b* is ignored. The scan vector SI2+SI1 (where + is a concatenation operation) is scanned into scan-in 320*b*, through mux 330 and partially into scan chain 310*a*. Likewise, the result (SO1+SO2) is scanned out of scan-out 340*a*. At least 2L shift clocks are required to perform this function since the scan chains are L cells long and, in this mode, they are connected together in series (2L). In this case, only 3 pins are used for scan data. This is almost a 100 percent savings in pins used to accomplish the same testing operations at an albeit lower performance level.

It is appreciated that this configuration is scalable and that many more scan chains are typically implemented in device 260*a* and that scan chains 310*a* and 310*b* are shown for example only. In an typical implementation, the scan and mux circuitry would be replicated many times over with all muxes having their select lines coupled together to provide the performance adjustments.

FIG. 4B illustrates another exemplary device under test 260*b* configured in accordance with the present invention. In this example, three different performance modes of operation are available: high; medium; and low and they are implemented using reconfiguration logic 330*a*–330*c* and related connections. In high performance mode, there are four separate scan chains (chains 310, 310*b*, 310*c* and 310*d*). In medium performance mode, there are two separate scan chains (chain 310*a*+310*b* and chain 310*c*+310*d*). Lastly, in low performance mode, there is one single scan chain (chain 310*a*+310*b*+310*c*+310*d*). Like the example of FIG. 4A, the configuration of FIG. 4B is scalable and is typically replicated many times over with common muxes having the same control lines coupled thereto.

On chip control logic 360 generates the appropriate control signals C0 and C1 based on the user performance mode selection signal 270*b*. The control lines 365 are coupled to each mux 330*a*–330*c* in the same fashion. Table I below illustrates the performance modes versus the control signals:

TABLE I

| C0 | C1 | Performance Level |
|---|---|---|
| 0 | 0 | High |
| 0 | 1 | Medium |
| 1 | 0 | Low |

When in high performance mode, all scan-ins 320*a*–320*d* are active and all scan-outs 340*a*–340*d* are active. The multiplexers 330*a*–330*c* each select input 00. Scan data, SI1, SI2, SI3 and SI4 are respectively scanned into each scan chain 310*a*–310*d*. Likewise, scan out data, SO1, SO2, SO3, and SO4, are respectively scanned out over scan-outs 340*a*–340*d*. In this mode, 9 pins are used for the scan data. This process requires L clock cycles, the length of each scan chain.

However, when in medium performance mode, only scan-ins 320*d* and 320*b* are active and only scan-outs 340*c*–340*a* are active. The multiplexers 330*a*–330*c* each select input 01. Two scan chains result, chain 310*a*+310*b* and scan chain 310*c*+310*d*. Scan data, SI2+SI1 is shifted into scan-in 320*b* and scan data SI4+SI3 is shifted into scan-in 320*d*. Likewise, scan out data SO1+SO2 is shifted out of scan-out 340*a* and scan data SO3+SO4 is shifted out of scan-out 340*c*. In this mode, 5 pins are used for the scan data and this process requires 2L clock cycles, the length of each resultant scan chain.

When in low performance mode, only scan-in 320*d* is active and only scan-out 340*a* is active. The multiplexers 330*a*–330*c* each select input 10. One large scan chain results, chain 310*a*+310*b*+310*c*+310*d*. Scan data, SI4+SI3+SI2+SI1, is shifted into scan-in 320*d* and likewise, scan out data SO1+SO2+SO3+SO4 is shifted out of scan-out 340*a*. In this mode, 3 pins are used for the scan data and this process requires 4L clock cycles, the length of each resultant scan chain.

With respect to FIG. 4A and FIG. 4B, the protocol unit 210 (FIG. 3) determines the test sequence that is applicable for any given performance mode and implements that test sequence to perform the test. The test sequence includes which scan-in pins are active and which scan-out pins are active for each mode. The test sequence also includes which scan-in vectors (e.g., SIn) are to be applied in which order to the active scan-ins. The test sequence also includes which scan out data vectors (e.g., SOn) are to be expected from which active scan-outs and in which order they are expected to be received. The test sequence can be stored as a computer program defining the different information for each performance mode, an example of this shown in FIG. 7B (described in more detail below). While the test sequence may change from one performance mode over another, it is appreciated that in accordance with the present invention, the actual scan-in data vectors, e.g., SIn, do not change. In effect, these scan-in data vectors become retargetable for different testers by way of the protocol unit 210 and the DFT logic added to each device under test 260.

FIG. 5 illustrates an exemplary device under test 260*c* having reconfiguration logic for reconfiguring the number of functional input/outputs pins required for testing in a high performance mode versus a low performance mode. FIG. 5 illustrates one manner in which functional inputs and outputs can be reconfigured into internal scan elements of the design. In high performance mode, all the functional input (FI) pins 430*a*–430*e* are active to receive five functional inputs. Multiplexers 450*a*–450*e* are controlled by control signal C3 367 to select their bottom inputs for high performance mode. These functional inputs are applied to the combinational logic 410 and five functional outputs F6–F10 are generated over 5 functional output pins 470*a*–470*e*. With respect to the functional input/output data, 10 pins are required to implement high performance mode. The control pin C3 is based on the mode selection signal which can be obtained from the scan data configuration (e.g., FIG. 4A). That is to say, the scan chain implementation 310*i* and 310*j* can be based on the example of FIG. 4A.

In low performance mode, none of the functional input (FI) pins 430*a*–430*e* are active. Instead, the functional input data are shifted into a series chain of clocked memory cells 440*a*–440*e* through a functional scan-in pin 420. Multiplexers 450*a*–450*e* are controlled by control signal C3 367 to select their top inputs for low performance mode. After shifting, these functional inputs are then applied to the combinational logic 410 and five functional outputs are generated and stored in series coupled clocked memory cells 460*a*–460*e*. In low performance mode, none of the 5 functional output pins 470*a*–470*e* are active. Instead, when the functional inputs are shifted in, these functional outputs are shifted out over functional output scan-out pin 472. With respect to the functional input/output data, 2 pins are required to implement low performance mode, pin 420 and pin 472. The control pin C3 is based on the mode selection signal which can be obtained from the scan data configuration (e.g., FIG. 4A). However, 5 extra clock signals are required because of the need to shift in/out the functional inputs and functional outputs. While the example of FIG. 4A shows separate functional pins and scan pins, in accordance with an embodiment of the present invention, the solution for the two types can be merged for cases where the functional pin and scan pin are shared.

It is appreciated that the protocol unit 210 (FIG. 3) is responsible for determining which functional input pins and which functional output pins are active and if functional input shifting and/or functional output shifting is required for any particular performance mode.

FIG. 6 illustrates a flow diagram of steps 500 performed by an embodiment of the present invention for performing tester retargetable patterns. Test application for high performance mode is similar to the conventional testing mode, therefore, the example shown in FIG. 6 is for the application of high performance (high pin count) test vectors by a low performance (low pin count) tester. It is assumed that some low performance selection is made (manual, automatic, etc.) and that a low performance tester is connected to the device under test. At step 510, the low performance tester sets-up its scan-in procedure and selects low performance protocol. The reconfiguration DFT circuit on-chip then configures the internal scan chains to implement long scan chains.

At step 520, scan-in is performed where the scan-in test vectors, SIn, are scanned into the device under test according to the selected test sequence as controlled by the protocol unit. In this example, the circuit of FIG. 4A is referenced and both scan chains are connected together to act as one long scan chain. Also, according to the example of FIG. 5, functional inputs are shifted into the functional input scan-in pin 420. At step 530, the scan data and functional inputs are applied to the circuit. At step 540 the outputs are computed. At step 550, the outputs are latched by the clock. At step 570, the scan-out is set-up where only the appropriate scan-out pins are known to be active.

At step 570, the scan-out data and the functional outputs are shifted out using the low performance test sequence. At step 580, the scanned out data is stored for a pass/fail determination by the low performance tester. Steps 510–580 can then be repeated for next scan vector. It should be noted that the scan-out operation (570) can be merged with the scan-in operation (520) of the adjacent test pattern. This overlapped operation is the typical way scan test patterns are applied.

Figure 7A:
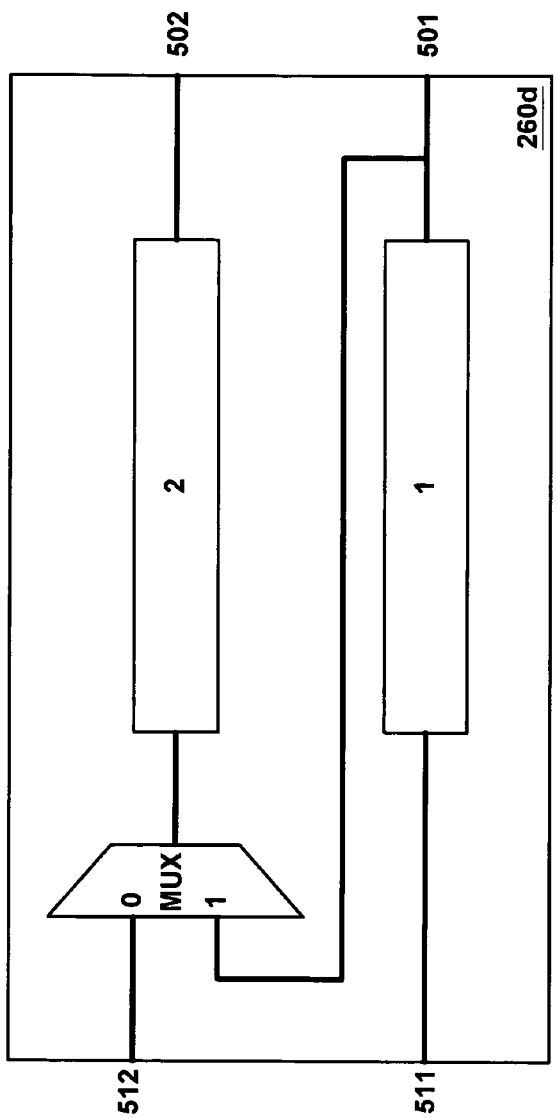
FIG. 7A illustrates an exemplary device under test in accordance with the present invention having reconfigurable scan chains and functional input/outputs.

A pseudo code example is given with respect to FIG. 7A and FIG. 7B. The pseudo code represents an example of the programming contained in the protocol unit 210 for performing a test sequence for high performance mode and a test sequence for low performance mode. As shown in FIG. 7A, the example device 260*d* contains two scan chains, "1" and "2," one reconfiguration mux, two scan-ins, SI1 and SI2, and two scan outs, SO1 and SO2. Not shown is a functional input shift register of the kind shown in FIG. 5 and having a functional scan-in, funcIn, and a functional scan-out shift register with a functional scan-out, funcOut.

FIG. 7B illustrates the resulting pseudo code 600 used by the protocol unit 210 for the example device of FIG. 7A. The pseudo code (using IEEE 1450 and IEEE 1450.1 capabilities and syntax) represents the testing sequences where the scan operation of consecutive test patterns are overlapped and is on the tester side. Code section 610 is used for high performance mode and section 620 is used for the low performance mode. The test vectors, SIn, are all the length of the individual scan chains "1" and "2", e.g., L bits long. In high performance mode, the "Shift" command 640 indicates that scan-in pin, SI1, receives test data "SI1" and scan-in pin, SI2, receives test data "SI2." This scans in the two scan chains. Further indicated is that scan-out pin, SO1, takes the scan-out vector "SO1" and scan-out pin, SO2, takes the scan-out vector "SO2." While scan-in is performed, scan-out also occurs simultaneously. The shift command therefore shifts in two scan chains simultaneously and also, simultaneously, shifts out two scan chains in the time of L clock cycles. The "V" command 650 is the step where the functional pins are applied some stimulus and values are measured. It indicates that the functional inputs are applied as separate pins, e.g., the functional input pins receive the functional input signals individually and that the functional output pins drive the functional output signals individually. The reconfiguration signal "many_inputs" indicates a high performance tester and controls the reconfiguration multiplexers.

Code section 620 is used for low performance mode. In low performance mode, the "Shift" command 660 indicates that scan-in pin, SI1, receives test vector "SI1 SI2" which is the two vector concatenated together. This scans in the two scan chains as one chain of length 2L. Further, that scan-out pin, SO2, takes the scan-out vector "SO2 SO1" of length 2L. While scan-in is performed, scan-out also occurs simultaneously. The shift command therefore shifts in two vectors simultaneously and also, simultaneously, shifts out two vectors in the time of 2L clock cycles. Importantly, command 670 indicates that the functional inputs are also shifted into the funcIn pin and the functional outputs are shifted out from the funcOut pin. The "V" command 680 is the data capture step. The reconfiguration signal "few_inputs" indicates a low performance tester. The following illustrates examples of the test vectors:

```
Do_one_test ( SI1=0000; SI2=0101; )
                                SO1_p=0110; SO2_p=1111; )]
```

where "_p" with the name denotes the fact that the values are obtained from the previous test vector that is overlapped with the current test vector. It should be noted that the data for "func_inputs," "func_outputs" and "func_outputs_p" are not shown in the sample test vector.

The foregoing descriptions of specific embodiments of the present invention, a method and system for automatically retargeting test vectors developed for a high performance tester to be applied by either a low performance tester or a high performance tester based on a mode selector, have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

The invention claimed is:

1. An integrated circuit device for communicating with a first tester of a first pin capacity to receive test vectors developed for a second tester of a second pin capacity, said device comprising:

scan chains; and reconfiguration logic coupled to said scan chains and for altering the number of pins required to test said device under test by reconfiguring the individual length and number of said scan chains based on a mode signal, wherein the number of said scan chains can be greater than one and less than a maximum number of scan chains, said reconfiguration logic providing compatibility between said test vectors and said second tester having said second pin capacity, said mode signal selecting between said first tester and said second tester.

2. A device as described in claim 1 wherein said second pin capacity is less than said first pin capacity.

3. A device as described in claim 2 wherein said second pin capacity is a low pin count and said first pin capacity is a high pin count.

4. A device as described in claim 1 wherein said reconfiguration logic comprises multiplexers coupled between selected ones of said scan chains and selected scan-in pins of said device under test.

5. A device as described in claim 1 wherein said reconfiguration logic comprises:

a functional input shift register for receiving functional inputs and used for a mode corresponding to said tester of said second pin capacity; and a functional output shift register for providing functional output values and used for said mode corresponding to said second pin capacity.

6. A device as described in claim 5 wherein said reconfiguration logic also comprises a respective multiplexer for each memory cell of said functional input shift register for selecting between a respective memory cell and a respective functional input pin based on said mode signal.

7. A device as described in claim 1 further comprising a protocol unit coupled to said mode signal and comprising a first test sequence used for said tester of said first pin capacity and containing a second test sequence used for said tester of said second pin capacity.

8. An automated testing equipment (ATE) system for testing an integrated circuit device comprising:

a storage medium for storing a set of test vectors developed for a tester having a first pin capacity;

a user selector selecting modes between a tester having said first pin capacity and a tester having a second pin capacity; and a device under test for coupling with one of said testers to receive said test vectors, said device under test comprising:

scan chains; and reconfiguration logic coupled to said scan chains and for altering the number of pins required to test said device under test by reconfiguring the individual length and number of said scan chains based on said user selector, wherein the number of said scan chains can be greater than one and less than a maximum number of scan chains, said reconfiguration logic providing compatibility between said test vectors and said tester having said second pin capacity.

9. A system as described in claim 8 wherein said second pin capacity is less than said first pin capacity.

10. A system as described in claim 9 wherein said second pin capacity is a low pin count and said first pin capacity is a high pin count.

11. A system as described in claim 8 wherein said reconfiguration logic comprises multiplexers coupled between selected ones of said scan chains and selected scan-in pins of said device under test.

12. A system as described in claim 8 wherein said reconfiguration logic of said device under test comprises:

a functional input shift register for receiving functional inputs and used for a mode corresponding to said tester of said second pin capacity; and a functional output shift register for providing functional output values and used for said mode corresponding to said second pin capacity.

13. A system as described in claim 12 wherein said reconfiguration logic of said device under test also comprises a respective multiplexer for each memory cell of said functional input shift register for selecting between a respective memory cell and a respective functional input pin based on said user selector.

14. A system as described in claim 8 further comprising a protocol unit coupled to said user selector and comprising a first test sequence used for said tester of said first pin capacity and a second test sequence used for said tester of said second pin capacity.

15. An automated testing equipment (ATE) system for testing an integrated circuit device, the ATE system comprising:

a storage medium for storing a set of test vectors developed for a tester having a high pin capacity;

a selector operable to select a test mode between a tester having said high pin capacity and a tester having a low pin capacity; and a device under test for coupling with one of said testers to receive said test vectors, functional input values and said test mode and for coupling to provide test results, said device under test comprising:

scan chains; and reconfiguration logic coupled to said scan chains and for altering the number of pins required to test said device under test by reconfiguring the individual length and number of said scan chains based on said test mode, wherein the number of said scan chains can be greater than one and less than a maximum number of scan chains, said reconfiguration logic providing compatibility between said test vectors and said tester having said low pin capacity.

16. A system as described in claim 15 wherein reconfiguration logic decreases the number of pins required to test said device under test for a test mode that is used for said tester having said low pin capacity.

17. A system as described in claim 15 wherein said low pin capacity is more than 64 pins and said high pin capacity is more than 1000 pins.

18. A system as described in claim 15 wherein said reconfiguration logic comprises multiplexers coupled between selected ones of said scan chains and selected scan-in pins of said device under test.

19. A system as described in claim 15 wherein said reconfiguration logic of said device under test comprises:

a functional input shift register for receiving functional inputs and used for a test mode corresponding with said tester of said low pin capacity; and a functional output shift register for providing functional output values and used for said test mode corresponding with said low pin capacity.

20. A system and described in claim 19 wherein said reconfiguration logic of said device under test also comprises a respective multiplexer for each memory cell of said functional input shift register for selecting between a respective memory cell and a respective functional input pin based on said test mode.

21. A system as described in claim 15 further comprising a protocol unit coupled to said user selector and comprising a first test sequence used for said tester of said high pin capacity and a second test sequence used for said tester of said low pin capacity.

22. In an automated testing equipment (ATE) system having a device to be tested, a method for testing said device comprising the steps of:

a) storing, in a storage medium, a set of test vectors developed for a tester having a first pin capacity;

b) selecting a test mode as between a tester having said first pin capacity and a tester having a second pin capacity; and c) in response to said step b), altering the number of pins required to test said device under test by reconfiguring the individual length and number of scan chains internal to said device based on said test mode, wherein the number of said scan chains can be greater than one and less than a maximum number of scan chains, wherein said altering provides compatibility between said test vectors and said tester having said second pin capacity.

23. A method as described in claim 22 further comprising the step of d) applying said test vectors to said device under test using said tester having said second pin capacity.

24. A method as described in claim 23 wherein said second pin capacity is less than said first pin capacity.

25. A method as described in claim 24 wherein said second pin capacity is a low pin count and said first pin capacity is a high pin count.

26. A method as described in claim 23 wherein said step c) is performed by reconfiguration logic that comprises multiplexers coupled between selected ones of said scan chains and selected scan-in pins of said device under test.

27. A method as described in claim 26 wherein said reconfiguration logic of said device under test also comprises:

a functional input shift register for receiving functional inputs and used for a test mode corresponding with said tester of said second pin capacity; and a functional output shift register for providing functional output values and used for said test mode corresponding with said second pin capacity.

28. A method as described in claim 27 wherein said reconfiguration logic of said device under test also comprises a respective multiplexer for each memory cell of said functional input shift register for selecting between a respective memory cell and a respective functional input pin based on said test mode selected.

29. A method as described in claim 23 wherein said step d) further comprises the steps of:

d1) applying a first test sequence used for said tester of said first pin capacity; and d2) applying a second test sequence used for said tester of said second pin capacity.

* * * * *